United States Patent
Chang

(10) Patent No.: US 8,446,161 B2
(45) Date of Patent: May 21, 2013

(54) METHOD OF SELF MONITORING AND SELF REPAIR FOR A SEMICONDUCTOR IC

(75) Inventor: Chingwen Chang, San Jose, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 650 days.

(21) Appl. No.: 12/625,235

(22) Filed: Nov. 24, 2009

(65) Prior Publication Data

US 2010/0237876 A1    Sep. 23, 2010

Related U.S. Application Data

(60) Provisional application No. 61/160,839, filed on Mar. 17, 2009.

(51) Int. Cl.
*G01R 31/3187* (2006.01)
*G01R 31/10* (2006.01)

(52) U.S. Cl.
USPC .................................. 324/750.3; 324/750.05

(58) Field of Classification Search
None
See application file for complete search history.

(56) References Cited

U.S. PATENT DOCUMENTS

| | | | |
|---|---|---|---|
| 5,138,619 A * | 8/1992 | Fasang et al. | 714/718 |
| 6,590,816 B2 * | 7/2003 | Perner | 365/200 |
| 6,728,910 B1 * | 4/2004 | Huang | 714/711 |
| 7,257,745 B2 * | 8/2007 | Huott et al. | 714/710 |
| 7,757,135 B2 * | 7/2010 | Nadeau-Dostie et al. | 714/723 |
| 7,873,890 B2 * | 1/2011 | Alaniz et al. | 324/754.19 |
| 7,969,168 B1 * | 6/2011 | Lin et al. | 324/750.3 |
| 8,014,968 B2 * | 9/2011 | Stakely et al. | 324/537 |
| 8,055,966 B1 * | 11/2011 | Sogani | 714/718 |
| 2001/0011904 A1 * | 8/2001 | Kaiser et al. | 324/765 |
| 2004/0225912 A1 * | 11/2004 | Ronza et al. | 714/5 |
| 2008/0065929 A1 * | 3/2008 | Nadeau-Dostie et al. | 714/5 |
| 2009/0063916 A1 * | 3/2009 | Vogelsang | 714/719 |
| 2009/0254788 A1 * | 10/2009 | Cervantes et al. | 714/733 |
| 2012/0069689 A1 * | 3/2012 | Yu et al. | 365/200 |

* cited by examiner

*Primary Examiner* — Jermele M Hollington
(74) *Attorney, Agent, or Firm* — Slater & Matsil, L.L.P.

(57) ABSTRACT

A method for self repair of a semiconductor IC is presented. An IC state is set to test/repair mode upon powering up the IC. Fuse data is loaded from an e-fuse module. Defects or faults are detected by employing a built in self test (BIST) module. The IC self repairs using redundant circuitry by employing a built in self repair (BISR) module to repair each fault using redundant circuitry. The fault locations and repair locations are stored in the e-fuse module. The semiconductor IC state is changed to mission mode.

20 Claims, 2 Drawing Sheets

METHOD OF SELF MONITORING AND SELF REPAIR FOR A SEMICONDUCTOR IC

This application claims the benefit of U.S. Provisional Application No. 61/160,839, entitled "Method of Self Monitoring and Self Repair for a Semiconductor IC," filed on Mar. 17, 2009, which is incorporated herein by reference.

TECHNICAL FIELD

The present invention relates generally to semiconductor integrated circuits (ICs), and more particularly to a system and method of self repair of a semiconductor IC during post production.

BACKGROUND

In the semiconductor industry, repair or fuse elements are a commonly used feature in integrated circuits (ICs) for improving manufacturing yield. By designing redundant circuitry into an IC and replacing defective circuits on the IC with the redundant circuits, manufacturing yields may be significantly increased. A typical process may include a test for functionality, if a defect or a fault is observed; the circuit path using the defective area is repaired. That is, the original circuit path with the fault is taken out of the circuitry by, for example, blowing a fuse and a redundant circuit path is opened. The fuses are selectively blown, for example, by passing an electrical current of a sufficient magnitude to cause the electromigration, melting, or blowing a transistor. The defective circuit path is thus effectively eliminated by creating a more resistive path or an open circuit. A fuse disconnected by a laser beam is referred to as a laser fuse, while a fuse disconnected by passing an electrical current or blowing may be referred to as a hard repair. Another method of repair is to reprogram the address of the fault with the address of the redundant circuit. This method may be termed a soft repair.

In either case, the process for running the diagnostics for uncovering fault locations and repairing them is typically limited to the test and repair process areas of a manufacturing facility. Once the IC is shipped, the capability for detailed diagnostics and repair is typically lost. Once an IC is deployed to the end user, the testing module, and repair module are not available to technicians or users of the systems in which the IC is incorporated. The test mode is tied off. This may cause field repair to be expensive and time-consuming. Therefore, while it is beneficial for a newly developed device type to have significant redundancy built into the design, as the device process matures and stabilizes, the redundancy on each IC is less used and may be considered a waste of valuable IC space.

Currently, if repair in the field is critical, field test modules designed for IC diagnostics in the field may be added to the IC. In some cases, the test diagnostics and the field diagnostics may be similar and the built in self test (BIST) modules may be redundant. Thus, the additional space on the IC is wasted.

What is needed then, is a new method and structure for self repair of semiconductor devices during post production that overcomes the above described shortcomings in the prior art.

SUMMARY OF THE INVENTION

This and other problems are generally solved or circumvented, and technical advantages are generally achieved by a system and method of self repair of a semiconductor IC during post production employing the built in self test and repair components and redundancy available in production test repair.

In accordance with an illustrative embodiment of the present invention, a method for self repair of a semiconductor IC is presented. The IC state is set to test/repair mode upon powering up the IC. An IC state, in an illustrative embodiment, may be either test/repair mode or mission mode, for example. Fuse data may be loaded from an e-fuse module. Fuse data may include the locations of faults and the locations of the repairs for those faults. Faults are detected by employing a built in self test (BIST) module. The IC self repairs using redundant circuitry by employing a built in self repair (BISR) module to repair each fault using redundant circuitry. The fault locations and repair locations (fuse data) are stored into the e-fuse module. The semiconductor IC state is changed to mission mode. Mission mode indicates that the IC is performing a function for which the IC was designed.

In accordance with another illustrative embodiment of the present invention, a semiconductor device is presented. The semiconductor device comprises a built in self test module, an error monitor, a built in self repair module, an e-fuse module, and a multiplexer, wherein the multiplexer sends signals from the error monitor to the built in self repair component, and wherein the multiplexer enables a testing mode or a mission mode of the semiconductor device.

Advantages of various embodiments of the present invention include providing a method of repairing a semiconductor IC within the end user environment. An advantage of an illustrative embodiment of the present invention is taking advantage of un-used redundancy built into the semiconductor IC.

The foregoing has outlined rather broadly the features and technical advantages of various illustrative embodiments in order that the detailed description of the invention that follows may be better understood. Additional features and advantages of an illustrative embodiment will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the illustrative embodiments as set forth in the appended claims.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the invention, and do not limit the scope of the invention.

The present invention will be described with respect to illustrative embodiments in a specific context, namely a semiconductor device having redundant memory in a memory array. The invention may also be applied, however, to other semiconductor devices comprising logic circuits with redundant circuitry. Embodiments may also include the electronic systems in which the various embodiments are incorporated.

Figure 1:
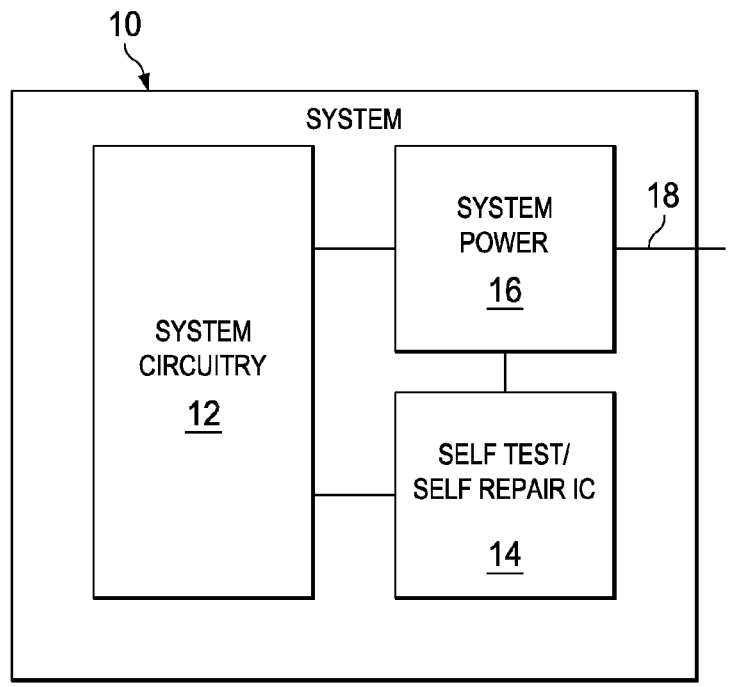
FIG. 1 shows a block diagram of selected major components of an illustrative embodiment.

Turning to FIG. 1 system 10 is shown which includes self test/self repair IC 14 in accordance with an illustrative embodiment. A system may be any assemblage or combination of parts forming a unit. System circuitry 12 may be separate from self test/self repair IC 14, as shown in FIG. 1, or in another embodiment, self test/self repair IC 14 may be included in system circuitry 12. System 10 may be any system that includes system power 16 and self test/self repair IC 14. System 10 may be deployed to the customer and be in use by the customer. Self test/self repair IC 14 may test and repair itself while deployed to the user. Self test/self repair IC 14 does a self test and repair (if necessary) upon the IC power up, which may occur during system power up. Power for the system may be provided externally to the system, such as power input 18.

Figure 2:
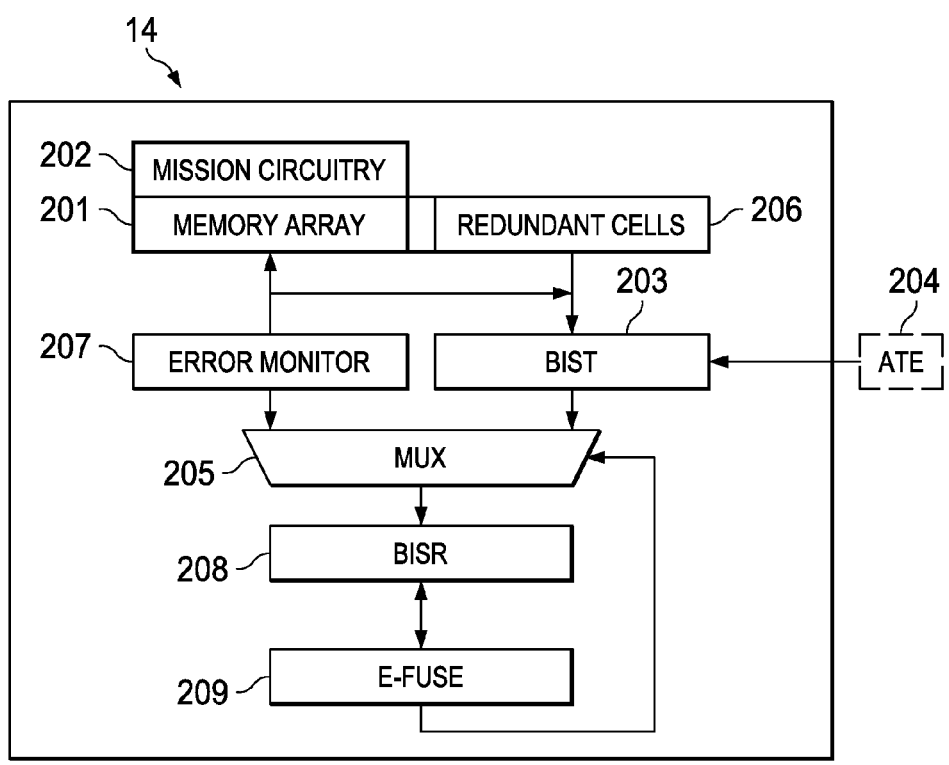
FIG. 2 is a block diagram showing the interconnectivity of selected components of an embodiment.

With reference now to FIG. 2, a block diagram illustrating the interconnectivity of selected components of an embodiment is shown. In this example, self test/self repair IC 14 is a memory device with memory array 201 and mission circuitry 202. Mission circuitry 202 may be any type of circuitry including logic, memory, or mixed signal. The term mission indicates that it is the circuitry, along with the memory array, that is tasked with accomplishing the IC's primary purpose. In other embodiments, other types of circuitry may be dominant, such as application specific logic, for example. Memory array 201 may be dynamic ram (DRAM), static dynamic ram (SRAM) or the like. Redundant cells 206 are redundant memory cells available to replace faulty memory cells in memory array 201. In another embodiment, redundant cells 206 may comprise redundant logic cells, for example.

Self test/self repair IC 14 has BIST module 203. BIST module 203 may be used during circuit test mode to reduce the prober time and efficiently test for failures. Repairs to self test/self repair IC 14 may also be done during test mode. Automated prober ATE 204 (shown in phantom) may control the IC test and repair, as shown in FIG. 2, during the circuit probe portion of the IC manufacture. The IC repair portion may be completed in laser repair equipment or by other methods known in the art.

Self test/self repair IC 14 is further comprised of multiplexer (MUX) 205 in accordance with an illustrative embodiment. A multiplexer is a circuit component that selects one of a plurality of analog or digital input signals and outputs a selected signal. In an illustrative embodiment, MUX 205 carries the IC state signals, the error monitor signals, the BIST signals, the BISR signals, and communication to and from the fuse module. Further discussion of MUX 205 follows below.

Built in self test modules, or BISTs, are traditionally used to make faster, less-expensive manufacturing tests by verifying all or a portion of the IC internal functionality. Historically the main purpose of a BIST is to reduce test complexity and reliance upon external test equipment such as ATE 204. There are several specialized versions of BISTs, which are differentiated according to what they do or how they are implemented. BIST modules may be programmable. BIST modules exist for logic ICs, as well as analog and mixed signal ICs. The BIST module typically includes a pattern generator for generating a series of simulation signals and successively stores and retrieves the simulation signals from an I/O buffer of the I/O cell. The test logic of the BIST module compares the stored and retrieved data to check whether the data matches for each iteration of storing and retrieving. If a mismatch is detected, the test logic may issue a fail signal to an error monitor, such as error monitor 207. BIST 203 is employed in the current example as a self test for memory array 201. BIST 203 is used outside of its traditional use in manufacturing tests, and is also used as a test module for the IC after deployment in a field system in accordance with the various embodiments.

Following the execution of the BIST test patterns, BISR circuitry, such as BISR 208, analyzes the BIST results and, in the event of detected faults, automatically reconfigures the faulty memory utilizing redundant memory elements to replace the faulty ones. The memory repair data may be programmed into the wafer die by blowing one or more fuses on the wafer die corresponding to the memory repair data, this is termed a hard repair. Alternatively, a soft repair may be implemented by reprogramming the address of the failed memory cell to an address of a working redundant memory cell. E-fuse module 209 is a type of memory wherein the faults and repairs for self test/self repair IC 14 are stored and retrieved upon system initialization.

Figure 3:
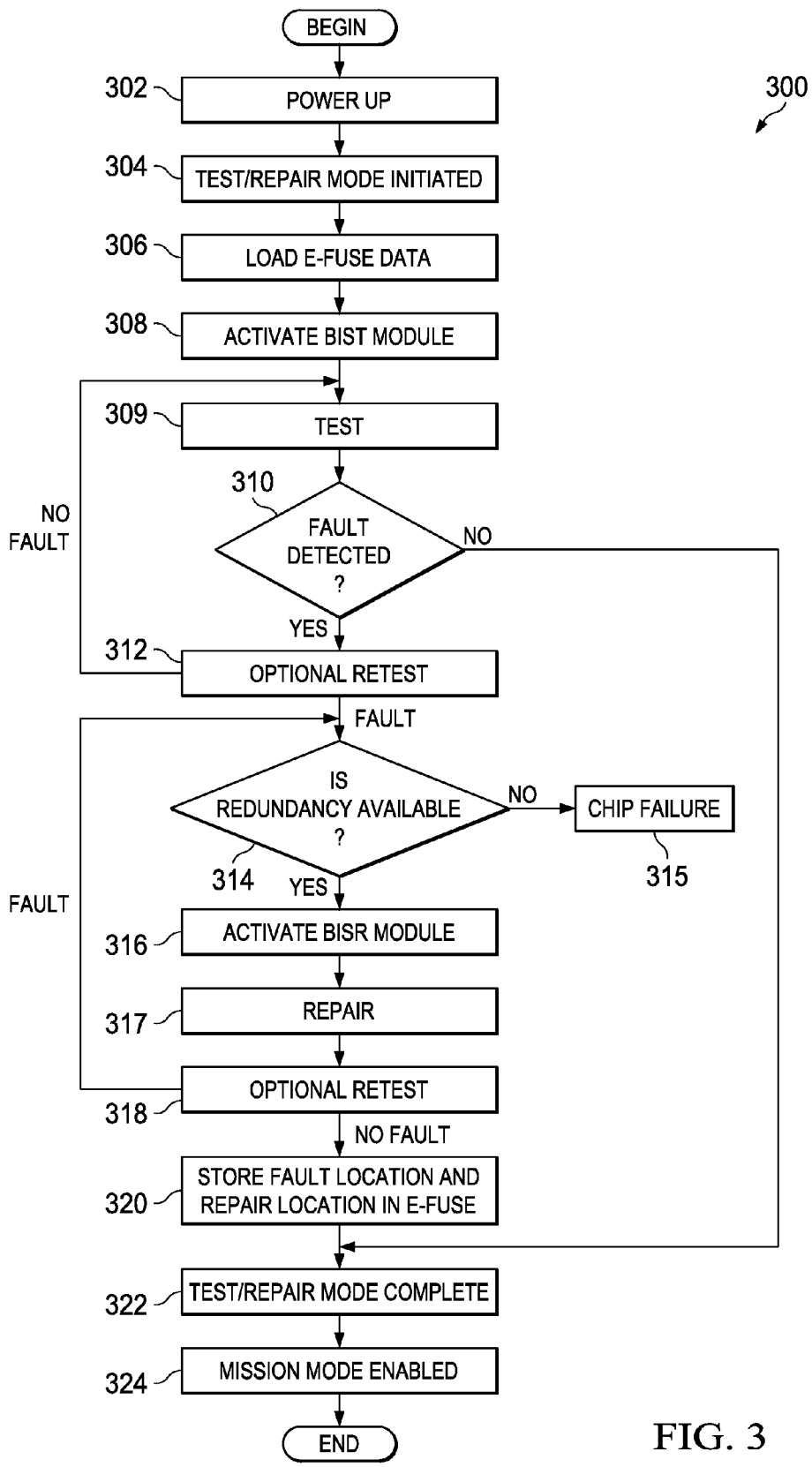
FIG. 3 is a flow chart of a method for self repair of an IC.

Turning now to FIG. 3, an illustrative embodiment of a method for self repair of an IC is shown in process flow 300. The process begins as the IC is powered up (step 302). This process may advantageously occur after the IC has been deployed to a user. The IC state as selected by the MUX is test/repair mode (step 304). There are two states that the IC may be in, mission mode and test/repair mode. The IC is operational during mission mode. Test/repair mode is the mode in which the IC may test and repair itself. An advantage of the various embodiments is that the IC does not need to be removed from the system nor does the system need to be removed from the user during test/repair mode. In other words, the tests and repairs are done in situ in the user's system, with no need for a field return.

In test/repair mode, the e-fuse data is loaded (step 306) into the mission circuitry such as mission circuitry 202 in FIG. 2. E-fuse data may be the addresses of all or some of the defective circuitry and all or some of the addresses of the repaired circuitry. The BIST module is activated (step 308). The BIST module tests the memory array (step 309), including any redundant cells that have been programmed as replacements to failed memory cells in a previous repair cycle. If no faults are detected (a no output of step 310), test/repair mode is complete. However, if a fault is detected (a yes output for a fault detected in step 310), then an optional retest (step 312) may confirm the results. The optional retest may be programmed into the BIST module. If the optional retest is done and no fault is found, the process returns to test (step 309), otherwise if the fault is confirmed, the process continues to step 314. Process flow 300 checks whether there are redundant components available to implement the repair (step 314). If no redundancy is available for the fault detected, the IC fails (step 315). However, if there is redundancy available for repair, the BISR module is activated (step 316). The component is repaired (step 317). The repair may be a soft repair and the redundant cell replacements are programmed into an e-fuse module or a hard repair may be accomplished by providing blowing a predetermined fuse. There may be an optional retest (step 318) after repair. If the repair is unsuccessful and the fault remains, the process returns to step 314.

However, if the optional test confirms the repair, the process continues to step 320. The fault location and the repair location are stored in the e-fuse module (step 320) upon repair. The test/repair mode is then complete (step 322) and a signal is sent to the MUX from the BIST module. The MUX enables mission mode (step 324), and thus the process ends. According to an illustrative embodiment, each time the IC is powered up, a self test cycle is implemented and a self repair cycle is implemented, if needed.

An optional error monitor may be added to the IC, such as shown in FIG. 2. If the IC has the optional error monitor, a fault may be detected in the IC during mission mode. A signal may then be sent to the MUX to initiate process flow 300.

Although the illustrative embodiment and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for self repair of an integrated circuit (IC), the method comprising:
    setting an IC state to test/repair mode from mission mode upon powering up the IC;
    loading fuse data from an e-fuse module;
    activating a built in self test (BIST);
    detecting each fault by implementing the BIST;
    employing built in self repair (BISR) to repair each fault using redundant circuitry;
    storing a first location of each fault and a second location of each fault repair into the e-fuse module; and
    resetting the IC state to mission mode.

2. The method of claim 1 further comprising, performing a retest after detecting a fault and before repairing the fault.

3. The method of claim 1 further comprising performing a post repair retest after repairing a fault and before storing a location of the fault.

4. The method of claim 3 further comprising performing both a retest after detecting a fault and before repairing the fault and a post repair retest.

5. The method of claim 1 further comprising validating an availability of redundancy after a fault is detected and before BISR is activated.

6. The method of claim 1 further comprising detecting all faults and then repairing all faults.

7. The method of claim 1, wherein the BISR is a hard repair.

8. The method of claim 1, wherein the BISR is a soft repair.

9. The method of claim 1 further comprising detecting a fault, and repairing the fault before implementing a test for a next fault.

10. The method of claim 1 further comprising indicating an IC failure upon detecting a fault and determining there is no redundancy available for repairing the fault.

11. A system comprising:
    system circuitry;
    system power electrically connected to the system circuitry; and
    a self test/self repair IC electrically connected to the system power, in electrical communication with the system circuitry, and performing a self test/self repair procedure without removal from the system, the self test/self repair IC comprising:
        a built in self test (BIST) component;
        a built in self repair (BISR) component;
        an e-fuse module, wherein the e-fuse module stores repair information; and
        a multiplexer switching an IC state to a test/repair mode upon powering up the IC, and switching the IC state to a mission mode following the test/repair mode.

12. The system of claim 11 further comprising an error monitor disposed within the self test/self repair IC and in electrical communication with at least the multiplexer, wherein the error monitor detects faults while the self test/self repair IC is functioning in the mission mode.

13. A method for self test/self repair of an integrated circuit (IC) within a system, the method comprising:
    allowing the IC to remain within the system;
    setting an IC state to a test/repair mode from a mission mode upon powering up the IC;
    loading fuse data from an e-fuse module;
    activating a built in self test (BIST);
    detecting each fault by implementing the BIST;
    employing a built in self repair (BISR) to repair each fault using redundant circuitry;
    storing a first location of a fault and a second location of a repair into the e-fuse module; and
    resetting the IC state to the mission mode.

14. The method of claim 13 further comprising performing a retest after detecting a fault and before repairing the fault.

15. The method of claim 13 further comprising performing a post repair retest after repairing a fault and before storing the first location of the fault and the second location of a repair of the fault.

16. The method of claim 15 further comprising performing both a retest after detecting a fault and before repairing the fault and a post repair retest.

17. The method of claim 13 further comprising validating an availability of redundancy after a fault is detected and before the BISR is activated.

18. The method of claim 13 further comprising detecting a fault and repairing the fault before implementing a test for a next fault.

19. The method of claim 13 further comprising indicating an IC failure upon detecting a fault and determining there is no redundancy available for repairing the fault.

20. The method of claim 13 further comprising indicating a system failure upon detecting an IC failure.

* * * * *